United States Patent
Miao et al.

(10) Patent No.: US 8,602,206 B2
(45) Date of Patent: Dec. 10, 2013

(54) DETECTING DEVICE AND CONVEYOR SYSTEM

(75) Inventors: Zhen-Yu Miao, Shenzhen (CN); Zhong-Kun Xiao, Shenzhen (CN)

(73) Assignees: Fu Tai Hua Industry (Shenzhen) Co., Ltd., Shenzhen (CN); Hon Hai Precision Industry Co., Ltd., New Taipei (TW)

(*) Notice: Subject to any disclaimer, the term of this patent is extended or adjusted under 35 U.S.C. 154(b) by 20 days.

(21) Appl. No.: 13/532,844

(22) Filed: Jun. 26, 2012

(65) Prior Publication Data
US 2013/0161158 A1    Jun. 27, 2013

(30) Foreign Application Priority Data
Dec. 27, 2011   (CN) .......................... 2011 1 0443280

(51) Int. Cl.
*B65G 43/10*   (2006.01)
*B65G 43/08*   (2006.01)

(52) U.S. Cl.
USPC ......... 198/575; 198/571; 198/572; 198/460.1

(58) Field of Classification Search
USPC ............................... 198/571, 572, 575, 460.1
See application file for complete search history.

(56) References Cited

U.S. PATENT DOCUMENTS

| | | | |
|---|---|---|---|
| 4,957,597 A |   | 9/1990 | Irwin |
| 5,322,154 A | * | 6/1994 | Lenherr ..................... 198/460.2 |
| 5,547,004 A | * | 8/1996 | Fransen ..................... 198/419.3 |
| 5,906,265 A | * | 5/1999 | Spatafora ................... 198/460.2 |
| 6,305,525 B1 | * | 10/2001 | Miller et al. ............... 198/460.2 |
| 6,341,685 B1 | * | 1/2002 | Spatafora et al. .......... 198/460.2 |

* cited by examiner

*Primary Examiner* — Leslie A Nicholson, III
(74) *Attorney, Agent, or Firm* — Altis Law Group, Inc.

(57) ABSTRACT

A conveyor system includes a splicing belt, a supporting member, a driving module, a trigger module, a detecting module. The splicing belt is attached to the first conveyor belt and the second conveyor belt for joining the second conveyor belt to the first conveyor belt. The supporting member supports the first conveyor belt and the second conveyor belt. The driving module drives the first conveyor belt to be moved relative to the supporting member. The trigger module is located between the supporting member and the first conveyor belt, and is triggered when the splicing belt is moved to be contacted with the trigger module. The detecting module records a trigger time when the trigger module is triggered, the trigger time is a material transition time at which the first materials being fed is changed to the second materials.

20 Claims, 3 Drawing Sheets

DETECTING DEVICE AND CONVEYOR SYSTEM

BACKGROUND

1. Technical Field

The disclosed embodiments relate to a detecting device and a conveyor system.

2. Description of Related Art

Many conveyor systems include a supporting member, a drive module, a first conveyor belt, a second conveyor belt, and a detection device. The first conveyor belt and the second conveyor belt are supported on the supporting member. The first conveyor belt is packaged with a plurality of materials, such as surface mount technology (SMT) capacitors; and the second conveyor belt is packaged with a plurality of materials, such as SMT resistors. Both the first conveyor belt and the second conveyor belt define a plurality of through holes. A colored tape is attached to the first conveyor belt and the second conveyor belt for joining the second conveyor belt to the first conveyor belt. The conveyor system is used for feeding the materials packaged on the first conveyor belt and the materials packaged on the second conveyor belt to a surface mounting machine.

When the detection device emits light to the first conveyor belt or the second conveyor belt, the emitted light passes through the through holes of the first conveyor belt or the through holes of the second conveyor belt, thus the detection device cannot receive reflected light from the first conveyor belt or the second conveyor belt. The drive module drives the first conveyor belt to be moved relative to the supporting member, when the colored tape is moved to reach the position of the detection device, the emitted light is blocked by the colored tape. Thus the detection device receives the reflected light from the colored tape, and records a material transition time when the materials packaged on the first conveyor belt being fed by the conveyor system is changed to the materials packaged on the second conveyor belt.

However, due to operation errors, the material packaged on the first conveyor belt or the second conveyor belt may block the through hole, so that when the detection device emits light to the first conveyor belt or the second conveyor belt, the emitted light may be blocked by the material on the first conveyor belt or on the second conveyor belt, thus the detection device mistakenly receives the reflected light from the first conveyor belt or the second conveyor belt, and mistakenly records the above material transition time.

Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the five views.

DETAILED DESCRIPTION

Figure 1:
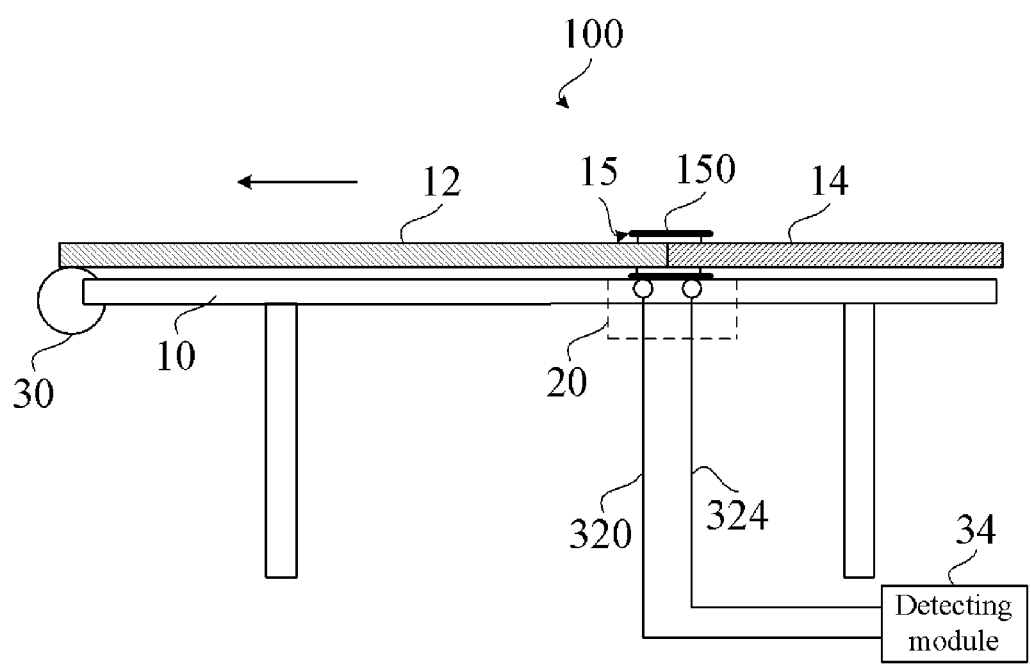
FIG. 1 is a schematic diagram showing a conveyor system in accordance with an embodiment, the conveyor system includes a trigger module and a detecting module.

Referring to FIG. 1, a conveyor system 100 includes a supporting member 10, a first conveyor belt 12, a second conveyor belt 14, a splicing belt 15, a trigger module 20, a driving module 30, and a detecting module 34.

The splicing belt 15 is attached to the first conveyor belt 12 and the second conveyor belt 14 for joining the second conveyor belt 14 to the first conveyor belt 12. The supporting member 10 supports the first conveyor belt 12, the second conveyor belt 14, and the splicing belt 15. The first conveyor belt 12 is packaged with a plurality of first materials, such as surface mount technology (SMT) capacitors; and the second conveyor belt 14 is packaged with a plurality of second materials, such as SMT resistors. In this embodiment, the conveyor system 100 is used for feeding the first materials packaged on the first conveyor belt 12 and the second materials packaged on the second conveyor belt 14 to a surface mounting machine (not shown).

The trigger module 20 is mounted to the supporting member 10 and is located between the supporting member 10 and the first conveyor belt 12.

The driving module 30 is mounted to the supporting member 10 and drives the first conveyor belt 12 to be moved relative to the supporting member 10, thus the splicing belt 15 and the second conveyor belt 14 are also moved relative to the supporting member 10. When the splicing belt 15 is moved to be contacted with the trigger module 20, the trigger module 20 is triggered. The detecting module 34 records a trigger time at which the trigger module 20 is triggered. The trigger module 20 is not triggered when one of the first conveyor belt 12 and the second conveyor belt 14 contacts with the trigger module 20. The trigger time is a material transition time at which the first materials packaged on the first conveyor belt 12 being fed is changed to the second materials packaged on the second conveyor belt 14. The splicing belt 15, the trigger module 20, and the detecting module 34 constitute a detecting device for recording a material transition time when a plurality of first materials packaged on the first conveyor belt 12 being fed by the conveyor system 100 is changed to a plurality of second materials packaged on a second conveyor belt 14.

Figure 2A:
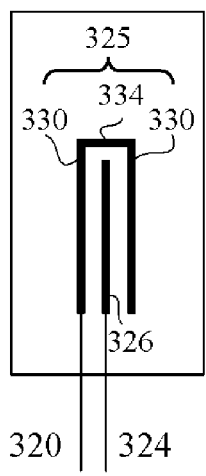
FIG. 2A is a schematic diagram showing the trigger module of FIG. 1, a detailed structure of the trigger module is shown in accordance with a first embodiment.

The trigger module 20 is connected to the detecting module 34 via a first conducting wire 320 and a second conducting wire 324. Referring to FIG. 2A, in a first embodiment, the splicing belt 15 includes a conductive area 150, and the trigger module 20 includes a first conducting portion 325 and a second conducting portion 326 electrically insulated from each other, the first conducting portion 325 and the second conducting portion 326 are respectively connected to the first conducting wire 320 and the second conducting wire 324.

In detail, the first conducting portion 325 is "n" shaped, the first conducting portion 325 includes two parallel conducting slices 330 and a connecting slice 334 for electrically connecting the two conducting portions 330, one of the two conducting slices 330 is connected to the first conducting wire 320. The second conducting portion 326 is located between the two conducting slices 330, and is parallel with each of the two conducting slices 330. When the splicing belt 15 contacts with the trigger module 20, the first conducting wire 320 is electrically connected to the second conducting wire 324 via the conductive area 150, therefore the detection device 34 detects that the trigger module 20 is triggered.

Figure 2B:
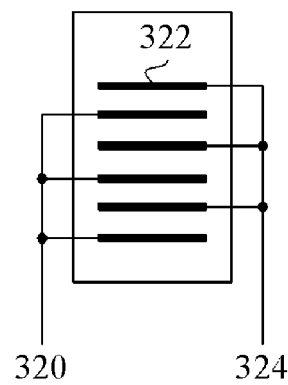
FIG. 2B is a schematic diagram showing the trigger module of FIG. 1, the detailed structure of the trigger module is shown in accordance with a second embodiment.

Referring to FIG. 2B, in a second embodiment, the trigger module 20 includes six conducting slices 322 electrically insulated from each other, the six conducting slices 322 are parallel to each other. The six conducting slices 322 are alternatively connected to the first conducting wire 320 and the second conducting wire 324, when the splicing belt 15 contacts with the trigger module 20, two adjacent conducting slices 322 are electrically connected by the conductive area 150, that is, the first conducting wire 320 is electrically connected to the second conducting wire 324, therefore the detection device 34 detects that the trigger module 20 is triggered.

Figure 2C:
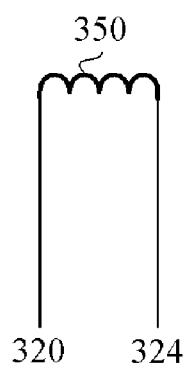
FIG. 2C is a schematic diagram showing the trigger module of FIG. 1, the detailed structure of the trigger module is shown in accordance with a third embodiment.

Referring to FIG. 2C, in a third embodiment, the splicing belt 15 is capable of generating a magnetic field, and the trigger module 20 is an induced coil 350, one end of the induced coil 350 is connected to the first conducting wire 320, and the other end of the induced coil 350 is connected to the second conducting wire 324. When the splicing belt 15 is moved to reach the position of the trigger module 20, the induced coil 350 generates an induced current, therefore the detection device 34 also detects that the trigger module 20 is triggered. However, when the trigger module 20 is triggered, the splicing belt 15 is not contacted with the trigger module 20.

Figure 3:
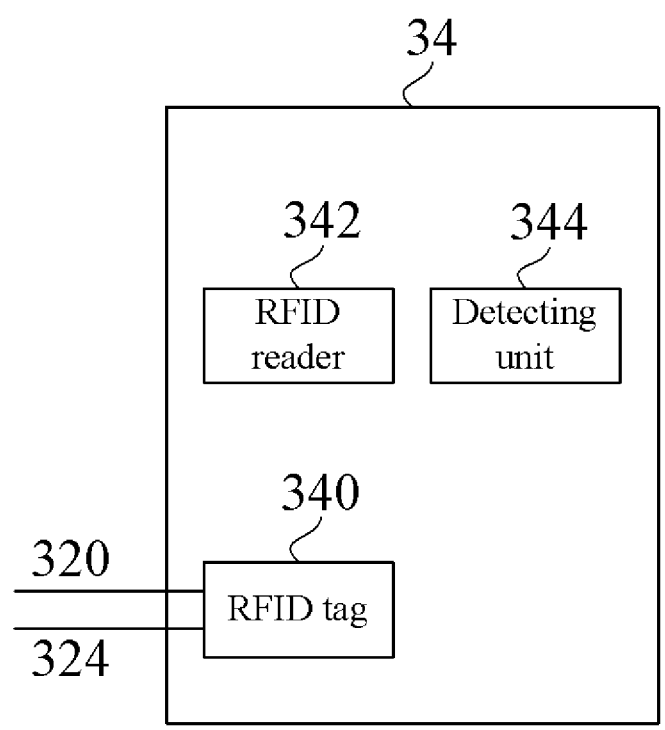
FIG. 3 is a block diagram of the detecting module of FIG. 1.

Referring to FIG. 3, the detection device 34 includes a radio frequency identification (RFID) tag 340, a RFID reader 342, and a detecting unit 344. The detecting unit 344 is connected to the RFID reader 342. The RFID tag 340 is connected to the trigger module 20 via the first conducting wire 320 and the second conducting wire 324. When the trigger module 20 is triggered, that is, the first conducting wire 320 is connected to the second conducting wire 324, the RFID tag 340 is activated to emit a wireless signal. The RFID reader 342 receives the wireless signal and transmits the wireless signal to the detecting unit 344, therefore the detecting unit 344 records the trigger time according to the wireless signal.

Since the splicing belt 15 includes the conducting area 150, and the trigger module 20 includes at least two conducting slices alternatively connected to the first conducting wire 320 and the second conducting wire 324, when the first conveyor belt 12 is driven by the driving module 30 to be moved relative to the supporting member 10, causing the splicing belt 15 to contact with the trigger module 20, the first conducting wire 320 is connected to the second conducting wire 324 via the conducting area 150, therefore the detecting module 34 records the material transition time at which the first materials packaged on the first conveyor belt 12 being fed is changed to the second materials packaged on the second conveyor belt 14. Compared to the prior art, even if the first conveyor belt 12 or the second conveyor belt 14 defines multiple through holes and the first materials block the through holes defined on the first conveyor belt 12 or the second materials block the through holes defined on the second conveyor belt 14 due to operation error, the trigger device 20 of the present disclosure cannot be mistakenly triggered, therefore the above material transition time being detected in the present disclosure is accurate.

Alternative embodiments will become apparent to those skilled in the art without departing from the spirit and scope of what is claimed. Accordingly, the present disclosure should not be deemed to be limited to the above detailed description, but rather only by the claims that follow and the equivalents thereof.

What is claimed is:

1. A conveyor system, comprising:
   a first conveyor belt packaged with a plurality of first materials thereon;
   a second conveyor belt packaged with a plurality of second materials thereon;
   a splicing belt for joining the second conveyor belt to the first conveyor belt;
   a supporting member for supporting the first conveyor belt and the second conveyor belt;
   a driving module mounted on the supporting member for driving the first conveyor belt and the second conveyor belt to be moved relative to the supporting member;
   a trigger module mounted to the supporting member and located between the supporting member and the first conveyor belt; wherein the trigger module is triggered when the splicing belt is moved to reach the position of the trigger module; and
   a detecting module for recording a trigger time when the trigger module is triggered, wherein the trigger time is a material transition time at which the first materials being fed by the conveyor system is changed to the second materials.

2. The conveyor system of claim 1, wherein the first materials are a plurality of surface mount technology (SMT) capacitors, and the second materials are a plurality of SMT resistors.

3. The conveyor system of claim 1, wherein the trigger module is triggered when the splicing belt is moved to be contacted with the trigger module, and the trigger module is not triggered when one of the first conveyor belt and the second conveyor belt contacts with the trigger module.

4. The conveyor system of claim 3, wherein the splicing belt comprises a conductive area, the trigger module is connected to the detecting module via a first conducting wire and a second conducting wire, the trigger module comprises at least two conducting slices electrically insulated from each other, the at least two conducting slices are alternatively connected to the first conducting wire and the second conducting wire, when the splicing belt contacts with the trigger module, the first conducting wire and the second conducting wire are electrically connected by the conductive area.

5. The conveyor system of claim 4, wherein the at least two conducting slices are parallel to each other.

6. The conveyor system of claim 3, wherein the splicing belt comprises a conductive area, the trigger module is connected to the detecting module via a first conducting wire and a second conducting wire, the trigger module comprises a first conducting portion and a second conducting portion electrically insulated from each other, the first conducting portion and the second conducting portion are respectively connected to the first conducting wire and the second conducting wire, when the splicing belt contacts with the trigger module, the first conducting wire is electrically connected to the second conducting wire via the conductive area.

7. The conveyor system of claim 6, wherein the first conducting portion comprises two conducting slices and a connecting slice for electrically connecting the two conducting slices, the second conducting portion is located between the two conducting slices, one of the two conducting slices is connected to the first conducting wire.

8. The conveyor system of claim 7, wherein the two conducting slices are parallel to each other, the second conducting portion is parallel to each of the two conducting slices.

9. The conveyor system of claim 1, wherein the splicing belt is capable of generating a magnetic field, the trigger module is an induced coil, two ends of the induced coil are all connected to the detecting module, when the splicing belt is moved to reach the position of the trigger module, the induced coil generates an induced current according to the magnetic field, the detecting module records the trigger time when the induced coil generates the induced current.

10. The conveyor system of claim 9, wherein one end of the induced coil is connected to the detecting module via a first conducting wire, and the other end of the induced coil is connected to the detecting module via a second conducting wire.

11. The conveyor system of claim 1, wherein the detecting module comprises a radio frequency identification (RFID) tag, a RFID reader, and a detecting unit connected to the RFID reader, the RFID tag is electrically connected to the trigger module, when the trigger module is triggered, the RFID tag is activated to emit a wireless signal, the RFID reader receives the wireless signal and transmits the wireless signal to the detecting unit, the detecting unit records the trigger time according to the wireless signal.

12. A detecting device for recording a material transition time when a plurality of first materials packaged on a first conveyor belt being fed by a conveyor system is changed to a plurality of second materials packaged on a second conveyor belt, the conveyor system comprising a supporting member for supporting the first conveyor belt and the second conveyor belt and a driving module mounted on the supporting member for driving the first conveyor belt and the second conveyor belt to be moved relative to the supporting member; the detecting device comprising:
a splicing belt for joining the second conveyor belt to the first conveyor belt;
a trigger module mounted to the supporting member and located between the supporting member and the first conveyor belt; wherein the trigger module is triggered when the splicing belt is moved to reach the position of the trigger module; and
a detecting module for recording a trigger time when the trigger module is triggered, wherein the trigger time is the material transition time.

13. The detecting device of claim 12, wherein the trigger module is triggered when the splicing belt is moved to be contacted with the trigger module, and the trigger module is not triggered when one of the first conveyor belt and the second conveyor belt contacts with the trigger module.

14. The detecting device of claim 13, wherein the splicing belt comprises a conductive area, the trigger module is connected to the detecting module via a first conducting wire and a second conducting wire, the trigger module comprises at least two conducting slices electrically insulated from each other, the at least two conducting slices are alternatively connected to the first conducting wire and the second conducting wire, when the splicing belt contacts with the trigger module, the first conducting wire and the second conducting wire are electrically connected by the conductive area.

15. The detecting device of claim 14, wherein the at least two conducting slices are parallel to each other.

16. The detecting device of claim 12, wherein the splicing belt comprises a conductive area, the trigger module is connected to the detecting module via a first conducting wire and a second conducting wire, the trigger module comprises a first conducting portion and a second conducting portion electrically insulated from each other, the first conducting portion and the second conducting portion are respectively connected to the first conducting wire and the second conducting wire, when the splicing belt contacts with the trigger module, the first conducting wire is electrically connected to the second conducting wire via the conductive area.

17. The detecting device of claim 16, wherein the first conducting portion comprises two conducting slices and a connecting slice for electrically connecting the two conducting slices, the second conducting portion is located between the two conducting slices, one of the two conducting slices is connected to the first conducting wire.

18. The detecting device of claim 17, wherein the two conducting slices are parallel to each other, the second conducting portion is parallel to each of the two conducting slices.

19. The detecting device of claim 12, wherein the splicing belt is capable of generating a magnetic field, the trigger module is an induced coil, two ends of the induced coil are all connected to the detecting module, when the splicing belt is moved to reach the position of the trigger module, the induced coil generates an induced current according to the magnetic field, the detecting module records the trigger time when the induced coil generates the induced current.

20. The detecting device of claim 19, wherein one end of the induced coil is connected to the detecting module via a first conducting wire, and the other end of the induced coil is connected to the detecting module via a second conducting wire.

* * * * *